United States Patent
Afghahi et al.

(10) Patent No.: US 6,903,952 B2
(45) Date of Patent: *Jun. 7, 2005

(54) CONTENT ADDRESSABLE MEMORY CELL TECHNIQUES

(75) Inventors: Morteza Cyrus Afghahi, Mission Viejo, CA (US); Bibhudatta Sahoo, Tustin, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/355,467

(22) Filed: Jan. 31, 2003

(65) Prior Publication Data

US 2003/0112672 A1 Jun. 19, 2003

Related U.S. Application Data

(63) Continuation of application No. 10/001,806, filed on Nov. 15, 2001, now Pat. No. 6,529,395.

(51) Int. Cl.[7] ............................................. G11C 15/00
(52) U.S. Cl. ..................... 365/49; 365/154; 365/189.07
(58) Field of Search ............................. 365/49, 189.07, 365/156, 154, 168, 203

(56) References Cited

U.S. PATENT DOCUMENTS

| | | | |
|---|---|---|---|
| 3,609,710 A | 9/1971 | Browne | 340/173 |
| 4,862,412 A | 8/1989 | Fried et al. | 365/49 |
| 5,752,260 A | 5/1998 | Liu | |
| 5,859,791 A | 1/1999 | Schultz et al. | |
| 5,999,435 A | 12/1999 | Henderson et al. | |
| 6,094,368 A | 7/2000 | Ching | |
| 6,181,591 B1 * | 1/2001 | Miyatake et al. | 365/49 |
| 6,195,278 B1 * | 2/2001 | Calin et al. | 365/49 |
| 6,496,399 B1 * | 12/2002 | Choi et al. | 365/49 |
| 6,529,395 B1 * | 3/2003 | Afghahi et al. | 365/49 |
| 6,661,687 B1 * | 12/2003 | Lien et al. | 365/49 |

OTHER PUBLICATIONS

Ghosh et al., "Novel Content Addressable Memory," *Electronics Letters*, IEE Stevenage, GB, vol. 25, No. 8, Apr. 13, 1989, pp. 524–526.

* cited by examiner

Primary Examiner—Gene N. Auduong
(74) Attorney, Agent, or Firm—McAndres, Held & Malloy

(57) ABSTRACT

A content addressable memory cell (10) includes a circuit (20) operating from a predetermined supply voltage (VDD) for storing a first bit of data at a first point (35) and a second bit of complementary data at a second point (36). A first transistor (40) comprising a first gate (42) is switchable to first and second states in response to predetermined relationships between the first and second bits and third and fourth test bits transmitted on first and second lines (14 and 16). Second and third transistors (50, 60) comprise gates (52, 62) coupled to the first line (14) and second line (16) and comprise circuit paths (54, 56, 64, 66) coupling the first and second points to the first gate.

16 Claims, 1 Drawing Sheet

CONTENT ADDRESSABLE MEMORY CELL TECHNIQUES

CROSS-REFERENCE TO RELATED APPLICATIONS

This is a continuation of U.S. application Ser. No. 10/001,806, entitled "CONTENT ADDRESSABLE MEMORY CELL TECHNIQUES," filed Nov. 15, 2001 now U.S. Pat. No. 6,529,395 in the names of Morteza Cyrus Afghahi et al.

BACKGROUND OF THE INVENTION

This invention relates to memory cells and more particularly relates to content addressable memory cells.

Many memory devices store and retrieve data by addressing specific memory locations. As a result, this path often becomes the limiting factor for systems that rely on fast memory access. The time required to find an item stored in memory can be reduced considerably if the stored data item can be identified for access by the content of the data itself rather than by its address. Memory that is accessed in this way is called content-addressable memory (CAM). CAM provides a performance advantage over other memory search algorithms (such as binary and tree-based searches or look-aside tag buffers) by comparing the desired information against the stored data simultaneously, often resulting in an order-of-magnitude reduction of search time.

A CAM cell is the basic circuit determining the speed, size and power consumption of CAM systems. Known CAM cells employ a match circuit that changes state depending on whether there is a match or mismatch between data stored in the cell and test data. In the past, the match transistor has provided an unreliable indication of a match because, under some conditions, the voltage transmitted to the gate of the match transistor has been in a range of values between the VDD supply of the cell and the reference potential used in the cell, such as ground potential. This range of values provides an ambiguous indication that is difficult to interpret. In addition, the circuitry involved in determining whether there is a match condition typically has drawn current from the bit lines supplying the test data. This current draw increases the power consumption of the cell, because the current is conducted through the bit line. The bit line driver must be larger because all the cells connected to the same bit line draw current. In some other circuits, there are two series transistors to detect a match. This makes the matching response slow. This invention addresses these problems and provides a solution.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

One apparatus embodiment of the invention is useful in a content addressable memory cell including a circuit operating from a predetermined supply voltage for storing a first bit of data at a first point and a second bit of data at a second point. The second bit of data is the complement of the first bit of data. The first bit of data and the second bit of data are compared with a third bit of test data transmitted on a first line and a fourth bit of test data transmitted on a second line. The fourth bit of data is the complement of the third bit of data. In such an environment, the comparison is aided by apparatus comprising in combination a first transistor comprising a first gate and also comprising a first circuit path switchable to a first state in response to a first predetermined relationship between the first and second bits and the third and fourth bits and switchable to a second state in response to a second predetermined relationship between the first and second bits and the third and fourth bits. A second transistor comprises a second gate coupled to the first line and comprises a second circuit path coupling the first point to the first gate. A third transistor comprises a third gate coupled to the second line and comprises a third circuit path coupling the second point to the first gate.

One method embodiment of the invention is useful in a content addressable memory cell including a circuit operating from a predetermined supply voltage and a predetermine reference potential for storing a first bit of data and a second bit of data. The second bit of data is the complement of the first bit of data. The first bit of data and the second bit of data are compared with a third bit of test data transmitted on a first line and a fourth bit of test data transmitted on a second line. The fourth bit of data is the complement of the third bit of data. In such an environment, the comparison is aided by employing a switching transistor comprising a gate in a method comprising in combination generating a first switching voltage substantially corresponding to the supply voltage in response to a first predetermined relationship between the first and second bits and the third and fourth bits while drawing substantially no current from the first line and second line. A second switching voltage substantially corresponding to the reference potential is generated in response to a second predetermined relationship between the first and second bits and the third and fourth bits while drawing substantially no current from the first line and second line. The first switching voltage is transmitted to the gate of the switch transistor in response to the first predetermined relationship, and the second switching. voltage is transmitted to the gate of the switch transistor in response to the second predetermined relationship.

By using the foregoing techniques, the data in a CAM can be compared with test data with a degree of accuracy and reliability previous unattained. In addition, the power consumption of the cell is reduced.

These and other advantages and novel features of the present invention, as well as details of an illustrated embodiment thereof, will be more fully understood from the following description and drawings.

DETAILED DESCRIPTION OF THE INVENTION

Figure 1:
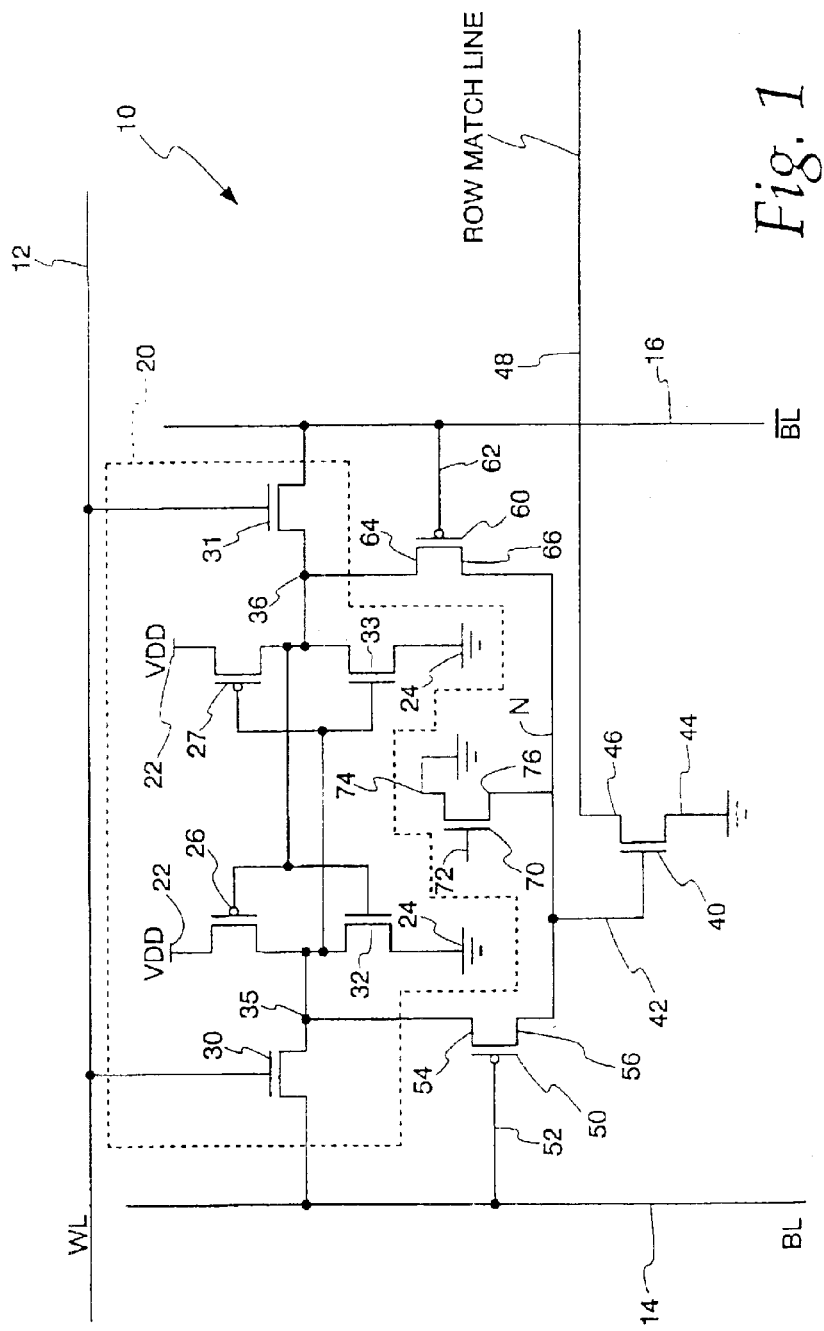
FIG. 1 is a schematic diagram of one embodiment of the invention.

Referring to FIG. 1, one embodiment of a CAM cell 10 embodying the invention includes a word line 12 and bit lines 14 and 16. A conventional static random access memory (SRAM) circuit 20 includes a source 22 of supply voltage VDD and a source 24 of a reference voltage, such as ground potential. Circuit 20 also includes p-channel transistors 26–27 and n-channel transistors 30–33 connected as shown. Voltage levels corresponding to stored data bits are stored at points 35–36 of circuit 20. The data bits stored at points 35–36 are complements of each other.

Test bits of data are transmitted on bit lines 14 and 16. The test bits of data also are complements of each other.

A switching n-channel match transistor 40 comprises a gate 42, a source 44 and a drain 46 that is connected to a row match line 48. A p-channel transistor 50 comprises a gate 52 connected to line 14, a source 54 connected to point 35 and a drain 56 connected to a node N as shown. A p-channel transistor 60 comprises a gate 62 connected to line 16, a source 64 connected to point 36 and a drain 66 connected to node N as shown. Since the gates of transistors 60 and 70 are connected to lines 14 and 16, respectively, transistors 60 and 70 draw substantially no current from lines 14 and 16.

A precharge n-channel transistor 70 comprises a gate 72 connected to a precharge circuit (not shown), a source 74 connected to ground potential and a drain connected to node N as shown.

In each of the foregoing transistors, the source-drain path forms a circuit path.

In operation, node N is first precharged to ground potential (a logical zero) by transistor 70, causing match transistor 40 to turn off. In this state, lines 14 and 16 are precharged to a voltage approaching VDD (a logical one), causing transistors 50 and 60 to turn off.

During a compare operation, one of lines 14 and 16 is switched to a logical one and the other of lines 14 and 16 is switched to a logical zero. The states of lines 14 and 16 represent test data that tests the data stored in circuit 20. If there is a mismatch between the data stored in circuit 20 and the test data, a voltage equal to VDD is generated on node N and is transmitted to gate 42, thereby reliably turning on transistor 40. During the transmission of VDD to gate 42, transistors 50 and 60 continue to draw substantially no current from lines 14 and 16. If there is a match between the data stored in circuit 20 and the test data, node N and gate 42 remain at ground potential, thereby reliably turning off transistor 40. When gate 42 is at ground potential, transistors 50 and 60 continue to draw substantially no current from lines 14 and 16.

For example, a mismatch occurs if a logical one is stored at point 35, a logical zero is stored at point 36, a logical zero is transmitted on line 14 and a logical one is transmitted on line 16. Conversely, a match occurs if a logical one is stored at point 35, a logical zero is stored at point 36, a logical one is transmitted on line 14 and a logical zero is transmitted on line 16.

While the invention has been described with reference to one or more preferred embodiments, those skilled in the art will understand that changes may be made and equivalents may be substituted without departing from the scope of the invention. In addition, many modifications may be made to adapt a particular step, structure, or material to the teachings of the invention without departing from its scope. Therefore, it is intended that the invention not be limited to the particular embodiment disclosed, but that the invention will include all embodiments falling within the scope of the appended claims.

What is claimed is:

1. In a content addressable memory cell including a circuit operating from a predetermined supply voltage for storing a first bit of data at a first point and a second bit of data at a second point, apparatus for comparing the first bit of data and the second bit of data with a third bit of test data transmitted on a first line and a fourth bit of test data transmitted on a second line, said apparatus comprising in combination:

a first transistor switchable to a first state in response to a first predetermined relationship between the first and second bits and the third and fourth bits and switchable to a second state in response to a second predetermined relationship between the first and second bits and the third and fourth bits;

a second p-channel transistor coupling the first point, first line and first transistor; and a third p-channel transistor coupling the second point, second line and first transistor.

2. The apparatus of claim 1 wherein the first transistor comprises a first gate and a first circuit path and wherein the means for coupling the first point to the first transistor comprises:

a second transistor comprising a second gate coupled to the first line and comprising a second circuit path coupling the first point to the first gate; and a third transistor comprising a third gate coupled to the second line and comprising a third circuit path coupling the second point to the first gate.

3. The apparatus of claim 2 wherein a gating voltage substantially equal to the predetermined supply voltage is transmitted to the first gate in response to the first predetermined relationship between the first and second bits and the third and fourth bits.

4. The apparatus of claim 3 wherein the first predetermined relationship comprises a mismatch between the first and second bits and the third and fourth bits.

5. The apparatus of claim 2 wherein the second transistor draws substantially no current from the first line and the third transistor draws substantially no current from the second line.

6. The apparatus of claim 2 wherein each of the second transistor and the third transistor comprises a p-channel transistor.

7. The apparatus of claim 6 wherein the first transistor comprises an n-channel transistor.

8. The apparatus of claim 2 and further comprising a precharge transistor arranged to turn off the first transistor.

9. The apparatus of claim 8 wherein the voltage on the first gate of the first transistor is reduced by the operation of the precharge transistor.

10. The apparatus of claim 9 wherein the precharge transistor comprises an n-channel transistor.

11. The apparatus of claim 2 wherein each of the first circuit path, second circuit path and third circuit path comprises a source-drain path.

12. The apparatus of claim 1 wherein the second bit of data is the complement of the first bit of data and wherein the fourth bit of data is the complement of the third bit of data.

13. In a content addressable memory cell including a circuit operating from a predetermined supply voltage and a predetermine reference potential for storing a first bit of data and a second bit of data, a first p-channel transistor and a second p-channel transistor, a method of comparing the first bit of data and the second bit of data with a third bit of test data transmitted on a first line and a fourth bit of test data transmitted on a second line, said method employing a switch transistor, said method comprising in combination:

generating a first switching voltage substantially corresponding to the supply voltage in response to a first predetermined relationship between the first and second bits and the third and fourth bits while drawing substantially no current from the first line and second line;

generating a second switching voltage substantially corresponding to the reference potential in response to a second predetermined relationship between the first and second bits and the third and fourth bits while drawing substantially no current from the first line and second line;

transmitting the first switching voltage through one of the first and second p-channel transistors to the switch-transistor in response to the first predetermined relationship; and transmitting the second switching voltage to the switch transistor through one of the first and second p-channel transistors in response to the second predetermined relationship.

14. The method of claim 13 wherein the first predetermined relationship comprises a mismatch between the first and second bits and the third and fourth bits.

15. The method of claim 13 wherein said generating a second switching voltage comprises precharging the gate of the switching transistor so that the switching transistor is turned off.

16. The method of claim 13 wherein the second bit of data is the complement of the first bit of data and wherein the fourth bit of data is the complement of the third bit of data.

* * * * *